(12) United States Patent
Usui et al.

(10) Patent No.: US 9,024,446 B2
(45) Date of Patent: May 5, 2015

(54) ELEMENT MOUNTING SUBSTRATE AND SEMICONDUCTOR MODULE

(75) Inventors: Ryosuke Usui, Ichinomiya (JP); Yusuke Igarashi, Isesaki (JP); Yasunori Inoue, Ogaki (JP); Mayumi Nakasato, Ogaki (JP); Masayuki Nagamatsu, Mizuho (JP); Yasuhiro Kohara, Hashima (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 155 days.

(21) Appl. No.: 13/381,299

(22) PCT Filed: Jun. 30, 2010

(86) PCT No.: PCT/JP2010/061172
§ 371 (c)(1),
(2), (4) Date: Dec. 28, 2011

(87) PCT Pub. No.: WO2011/002031
PCT Pub. Date: Jan. 6, 2011

(65) Prior Publication Data
US 2012/0098137 A1 Apr. 26, 2012

(30) Foreign Application Priority Data
Jun. 30, 2009 (JP) ................................. 2009-155751

(51) Int. Cl.
*H05K 1/00* (2006.01)
*H05K 3/44* (2006.01)
(Continued)

(52) U.S. Cl.
CPC ............ *H05K 3/445* (2013.01); *H01L 23/3735* (2013.01); *H05K 1/05* (2013.01); *H01L 2224/48091* (2013.01); *H05K 1/053* (2013.01); *H05K 1/056* (2013.01); *H05K 1/185* (2013.01);
(Continued)

(58) Field of Classification Search
USPC ................... 257/774, 700, 744; 174/258–260
See application file for complete search history.

(56) References Cited

U.S. PATENT DOCUMENTS 5,847,327 A * 12/1998 Fischer et al. ................ 174/258
2007/0074900 A1 * 4/2007 Lee et al. ...................... 174/260

FOREIGN PATENT DOCUMENTS

| JP | 55-19853 A | 2/1980 |
| JP | 63-72180 A | 4/1988 |

(Continued)

OTHER PUBLICATIONS

International Search Report with English translation issued in PCT/JP2010/061172 issued Aug. 31, 2010.
(Continued)

*Primary Examiner* — Matthew Reames
(74) *Attorney, Agent, or Firm* — McDermott Will & Emery LLP

(57) ABSTRACT

Conventional printed circuit boards had a problem of being inferior in heat-radiation characteristic, and metal-core printed circuit boards adopted to improve the heat-radiation characteristic had problems in having low rigidity and a tendency to bend. The ductility of the metal can be obstructed, and the metal protected; by covering substantially the whole area of the front and back sides of the metal core, consisting of metal as the main material, with a first ceramic film and a second ceramic film that obstruct the ductility of the aforementioned metal-core; and covering each of the ceramic films with insulated resin films, to cover the fragility of these ceramics.

6 Claims, 13 Drawing Sheets

(51) Int. Cl.
  *H01L 23/373* (2006.01)
  *H05K 1/05* (2006.01)
  *H05K 1/18* (2006.01)
  *H01L 23/00* (2006.01)

(52) U.S. Cl.
  CPC .. *H05K 2201/0195* (2013.01); *H05K 2201/068* (2013.01); *H01L 24/48* (2013.01)

(56) References Cited

FOREIGN PATENT DOCUMENTS

| | | |
|---|---|---|
| JP | 08-023145 A | 1/1996 |
| JP | 6-318782 A | 11/1997 |
| JP | 10-012982 A | 1/1998 |
| JP | 2004-031732 A | 1/2004 |
| JP | 2007-180083 A | 7/2007 |
| JP | 2008-060372 A | 3/2008 |
| JP | 2009-081423 A | 4/2009 |
| WO | WO 2008/069260 A1 | 6/2008 |

OTHER PUBLICATIONS

International Preliminary Report on Patentability with English translation issued in PCT/JP2010/061172 issued on Feb. 14, 2012.

* cited by examiner

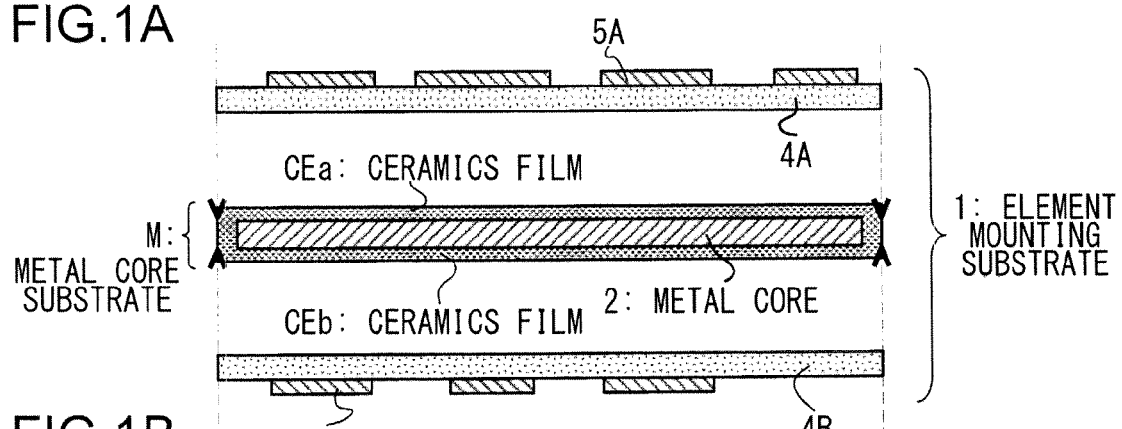
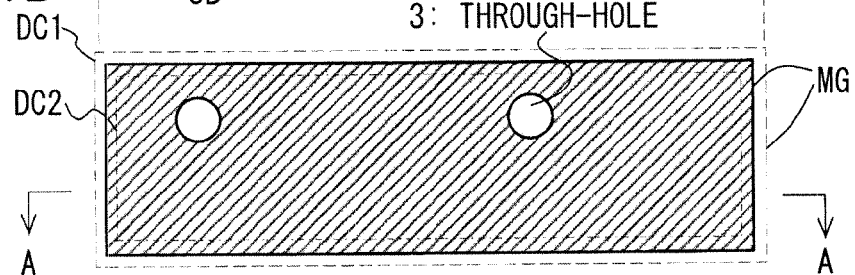

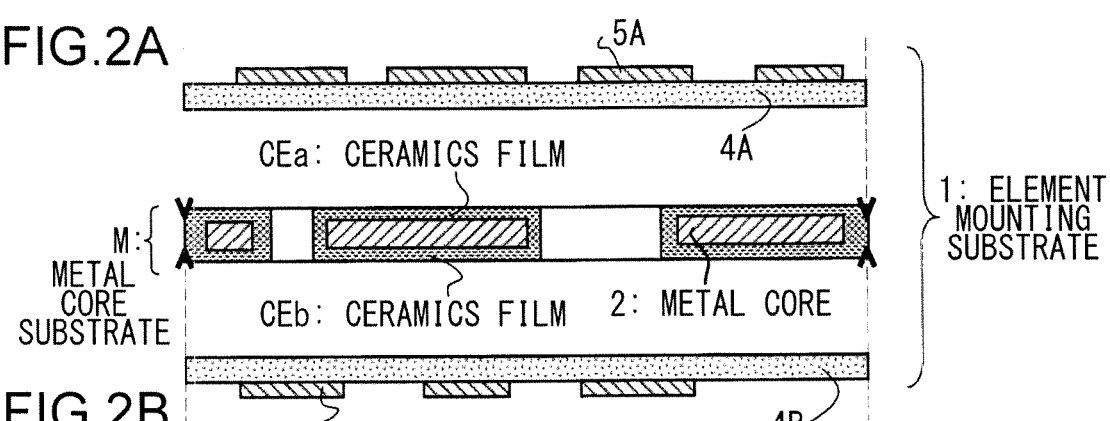
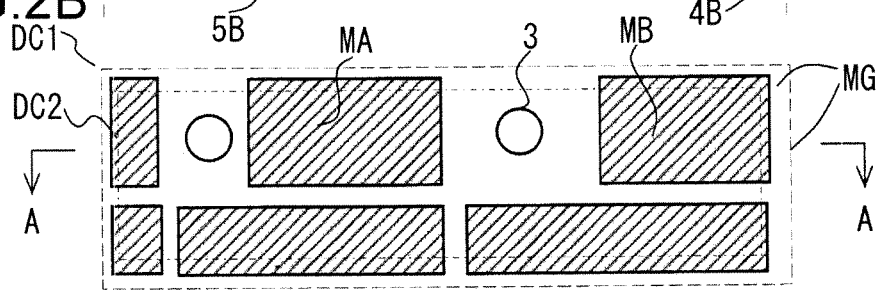

100A

100B

ELEMENT MOUNTING SUBSTRATE AND SEMICONDUCTOR MODULE

RELATED APPLICATIONS

This application is the U.S. National Phase under 35 U.S.C. §371 of International Application No. PCT/JP2010/061172, filed on Jun. 30, 2010, which in turn claims the benefit of Japanese Application No. 2009-155751, filed on Jun. 30, 2009, the disclosures of which Applications are incorporated by reference herein.

BACKGROUND OF THE INVENTION

1. Field of the Invention

The present invention relates to an element mounting substrate.

2. Description of the Related Art

Recently, a cell-phone, a small computer, and so on are required to be further miniaturized, accordingly a semiconductor device and a semiconductor module are reduced in weight, thickness, length, and size. In a set incorporating the semiconductor device and the semiconductor module, many ICs are incorporated into a limited small volume, and therefore, a heat dissipation problem occurs. Further, since the semiconductor device and the semiconductor module aim more functions and a higher current in the small volume, the heat dissipation problem occurs.

Hereinafter, the conventional structure will be described with reference to FIG. 7.

FIG. 7 illustrates a semiconductor device 100 employing an element mounting substrate comprising a metal core. FIG. 7A is a plan view of the semiconductor device. FIG. 7B is a cross-sectional view along A-A' line of the semiconductor device. The element mounting substrate employs a metal core 101 at the center as the core, and the front surface side is coated with an insulating resin 102A, and the rear surface side is coated with an insulating resin 102B. In the element mounting substrate, conductive patterns 103A and 103B are provided respectively on the insulating resins 102A and 102B. In this case, there is provided a double-layered structure in which the insulating resin layers 102A and 102B and the conductive patterns 103A and 103B are formed on the front and rear sides; however, the conductive patterns may be further stacked to provide a four-layered structure, a six-layered structure, or more.

A semiconductor element 104 such as an LSI is secured to the element mounting substrate through a solder ball 106 formed corresponding to the conductive pattern 103A, and an insulating resin film 105 seals to cover the semiconductor element 104 while remaining a periphery of the element mounting substrate, whereby the semiconductor device 100 is formed. The semiconductor device 100 employing the element mounting substrate comprising the metal core thus has the effect of diffusing heat generated from the semiconductor element 104 through the metal core 101 and thereby reducing the temperature of the semiconductor element 104.

In FIG. 7, in order to reduce the thickness of the entire semiconductor device 100 as much as possible, the semiconductor element 104 is made face-down to be mounted. In this case, the heat emitted from the semiconductor element 104 is emitted to the metal core 101 through the solder ball 106 and the conductive pattern 103A, so that the temperature of the semiconductor element 104 is less likely to be reduced. Namely, since the flow of heat from the semiconductor element 104 is regulated by the solder ball 106 which is a neck portion, the temperature of the semiconductor element 104 is less likely to be reduced.

FIG. 8 shows a semiconductor device (semiconductor module) mounted with the semiconductor element.

FIG. 8A shows a structure of a semiconductor module 100A mounted with the face-up semiconductor element 104. Because of the face-up mounting, the thickness of the semiconductor module 100A itself is increased by the height of a thin metallic wire 107. However, in comparison with the case where the rear surface of the semiconductor element 104 is connected to the element mounting substrate by the solder ball, the semiconductor element 104 is secured in a larger area, and therefore, the temperature of the semiconductor element 104 is significantly reduced in comparison with the case of mounting the semiconductor element in FIG. 7.

FIG. 8B shows a semiconductor module 100B that is not coated with the insulating resin film 105, and passive elements such as a semiconductor element and a chip capacitor are mounted on the element mounting substrate. In the present view, although the semiconductor element 104 is secured using the thin metallic wire, the semiconductor element 104 may be secured through a bump as shown in FIG. 7.

As described above, when a heat radiation property is required in a slimline package and a module employing a substrate, a metal core substrate is preferably employed. However, as the metal core, Cu is mainly employed, and the thickness is approximately 250 µm to 500 µm. Accordingly, in a double-layered conductive pattern and a four-layered conductive pattern, the thickness is approximately 1 mm, and therefore, the metal core is easily plastically deformed. Once a metal is plastically deformed, the metal cannot be returned to the original shape unless it is deformed again in the opposite direction, and therefore, this leads to reduction in yield in a manufacturing process. In finished products, the reliability may be reduced. Further, a difference of a thermal expansion coefficient α between an insulating resin and Cu causes warpage. The warpage is generated in a direction shown by the curved arrow in FIG. 8. In addition, each thermal expansion coefficient is different depending on materials. For example, the thermal expansion coefficient of the insulating resin film is 10 to 15 ppm, the thermal expansion coefficient of the substrate is 13 to 15 ppm in the X and Y directions and 23 to 33 ppm in the Z direction, and the thermal expansion coefficient of Si is 2.5 ppm. Thus, the reliability of the semiconductor element itself is reduced. Accordingly, substrate that can maintain the flatness as much as possible is preferably used.

SUMMARY

In view of the above problems, an element mounting substrate comprising at least three metal core substrates arranged such that insulating resin is embedded between the metal core substrates, each metal core substrate including, a metal core mainly composed of metal, a first ceramic film formed on one main surface of the metal core, a second ceramic film formed on the other main surface of the metal core, a first insulating resin film formed on a surface of the first ceramic film; and a second insulating resin film formed on a surface of the second ceramic film. The insulating resin between two metal core substrates adjacent to each other is not extended from one side of the element mounting substrate to the opposing side, and another metal core substrate is arranged in the middle thereof, so that the insulating resin is blocked there.

BRIEF DESCRIPTION OF THE DRAWINGS

FIG. 1 is a view of an element mounting substrate according to a first embodiment of the present invention;

FIG. 2 is a view of an element mounting substrate according to a second embodiment of the present invention;

DETAILED DESCRIPTION

Figure 3A:
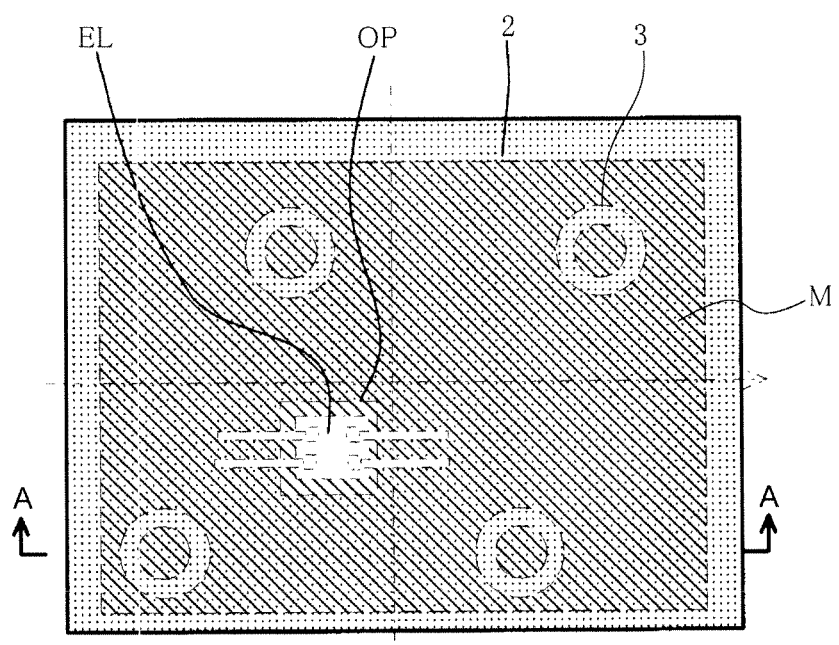
FIG. 3 is a view of an element mounting substrate according to one embodiment of the present invention.

Hereinafter, the present invention will be described. FIG. 1 is a view of an element mounting substrate according to a first embodiment of the present invention. FIG. 1A is an exploded cross-sectional view for explaining a constitution of the element mounting substrate as viewed from the cross section along A-A line of FIG. 1B. FIG. 1B is a perspective views of the element mounting substrate as viewed in a planar manner.

An element mounting substrate 1 has a metal core 2 and a metal core substrate M constituted of a ceramic film CEa formed on a front surface of the metal core 2 and a ceramic film CEb formed on a rear surface of the metal core 2. The ceramic films CE may be formed by applying a ceramic material to the metal core 2 or may be formed by applying chemical treatment to the metal core 2. An insulating resin film 4A is formed on a surface of the ceramic film CEa, and an insulating resin film 4B is formed on a surface of the ceramic film CEb. Further, a conductive pattern 5A is formed on a surface of the insulating resin film 4A, and a conductive pattern 5B is formed on a surface of the insulating resin film 4B. The conductive pattern 5A is constituted of an island on which a semiconductor element is mounted, an electrode connected to the semiconductor element, a passive element, and so on, and a wiring extended integrally with the island or the electrode. Although the conductive pattern 5B is mainly an external electrode, the island, the electrode, the wiring, and so on may be provided.

Although the element mounting substrate shown here has a structure of double-layered conductive patterns including the front and rear sides, the element mounting substrate may be a multilayer substrate with four layers, six layers, or more provided by repeatedly stacking the insulating resin film and the conductive pattern.

Metal has the property of not returning to the original shape after being plastically deformed. Thus, in order to improve the flatness of the metal core 2 employing metal, the ceramic films CEa, CEb are arranged on the both sides of the metal core in the embodiment. Since the ceramic film CEa, CEb has a high rigidity and thus is less likely to be deformed, the warpage due to the plastic deformation of the metal core 2 can be prevented. Meanwhile, brittleness peculiar to ceramic is solved by arranging the insulating resin films on the front and rear sides.

As viewed from the cross section of the element mounting substrate 1, in the element mounting substrate 1, the ceramic film and the insulating resin film 4A, 4B with the same material and thickness are symmetrically arranged on the front and rear sides of the metal core 2 as the center. Thus, the extending ways on the front side and the rear side are the same, and in view of this, the warpage can be prevented.

The metal (metal core 2) used as a core material includes metal mainly composed of Cu or Al, for example. Since the metal mainly composed of Cu has a high level of heat radiation property, the metal is suitably used in a power system module handling a high current. Meanwhile, although the metal mainly composed of Al is inferior to Cu, the metal has a high level of heat radiation property. Particularly in the case of Al, the weight is smaller than Cu, and, in addition, a film formed by self-oxidation and self-generation (aluminum oxide, alumina film) has a high level of resistance and rigidity; therefore, the metal mainly composed of Al is suitably used when flatness and heat radiation property are required at the same time.

As the ceramic film CEa, CEb, an alumina film is suitably used. When a metal core 2 mainly composed of Al is used, the alumina film can be formed in a self-generating manner by an anodic oxidation method, for example. The alumina film formed by the anodic oxidation method is γ alumina and an amorphous film in general. As the alumina film, α alumina is suitably used. α alumina has a high level of chemical stability and mechanical strength because of the crystal structure, and the electrical insulation resistance is large. As one method of forming alumina, there is a submerged plasma process. Since the alumina film formed by the submerged plasma process has a microcrystalline structure, the brittleness is low. Further, since such a porous layer that is formed in the alumina film when the alumina film is formed by the anodic oxidation method, for example, is not generated, fine alumina pieces are less likely to be generated at the time of cutting. Thus, as the ceramic film formed on a surface of the metal material, alumina with no porous layer is used, whereby scattering of ceramic pieces can be suppressed when a through-hole is formed or a substrate is diced into individual pieces, and fabrication yield can be improved.

It is preferable that the thickness of the ceramic film CEa, CEb is larger than the film thickness of the metal core 2 used as the core material. The thickness of the ceramic film CEa, CEb is increased, whereby a good high-frequency property as a feature of a ceramic substrate can be enjoyed, and, in addition, a metal material thinner than the ceramic film is provided between the ceramic films, whereby a substrate having a high level of impact resistance can be provided. It is preferable that the thickness of an internal metal material is not less than 50 μm. If the thickness is smaller than this value, the impact resistance cannot be obtained. Further, it is preferable that the thickness of the internal metal material is not more than 500 μm. If the thickness is larger than this value, the entire thickness of the element mounting substrate is increased, and therefore, it is undesirable.

The element mounting substrate 1 has through-holes 3. When the ceramic film CE is formed in a self-generating manner as described above, the ceramic film CE can be easily formed on a side wall of the through-hole 3.

FIG. 2 shows a second embodiment of the element mounting substrate of the present invention. FIG. 2A is an exploded cross-sectional view for explaining a constitution of the element mounting substrate as viewed from the cross section along A-A line of FIG. 2B. FIG. 2B is a perspective view of the element mounting substrate as viewed in a planar manner.

A difference between the first embodiment shown in FIG. 1 and the second embodiment shown in FIG. 2 will be described. In the first embodiment shown in FIG. 1, a single metal core substrate M is provided on the entire area of the element mounting substrate 1 or the substantially entire area except for some amount of margin MG. As upper and lower contacts, the through-holes 3 are provided in a portion of the single metal core substrate M, and the upper and lower portions are in contact with each other through the through-holes 3. The detail will be described later with reference to FIG. 3.

Meanwhile, in the second embodiment shown in FIG. 2, the metal core substrate M is provided on the entire area or the area except for the margin MG, and the metal core substrate M is not the single metal core substrate shown in FIG. 1, but the metal core substrate M is constituted of metal core substrates MA, MB, and the following metal core substrates as a plurality of pieces. The metal core substrates are separated in the form of an island and arranged on substantially the same plane. Extracted portions of electrodes on the front and rear sides of the element mounting substrate are connected through the through-hole 3 between the two metal cores MA and MB.

In both the structures shown in FIGS. 1 and 2, the metal core 2 is provided in the center. The metal core 2 is formed of metal or metal alloy, for example, and has a thickness of approximately 50 µm to 500 µm. The metal core is formed of Cu or mainly composed of Cu or is formed of Al or mainly composed of Al. (Here, "the metal core is mainly composed of metal" means that most of the metal core is formed of a metal material, impurities are contained therein on the order of ppm, and the characteristics are improved.)

When the metal core is used in a set having reduced weight, thickness, length, and size and required to have a heat radiation property, it is preferable that the metal core 2 is formed of Al or mainly composed of Al. The Al material is lightweight although the thermal conductivity is slightly inferior to Cu, and in the Al material, a hard ceramic film having rigidity can be formed in a self-generating manner.

The insulating resin film 4A is formed on the surface of the ceramic film CEa formed on the front surface of the metal core 2, and the insulating resin film 4B is formed on the surface of the ceramic film CEb formed on the rear surface of the metal core 2. Since the ceramic film is brittle and easy to break, the surface of the ceramic film is coated with the insulating resin film 4, and the drawbacks are solved. Since the rigidity of the element mounting substrate 1 is increased by the ceramic film CEa, CEb, a filler may not be mixed in the insulating resin film 4A, 4B. If a glass fiber or the like is woven into the insulating resin film 4A, 4B, or a filler is mixed therein, the glass fiber or the filler may become dust in the dicing.

Figure 3B:
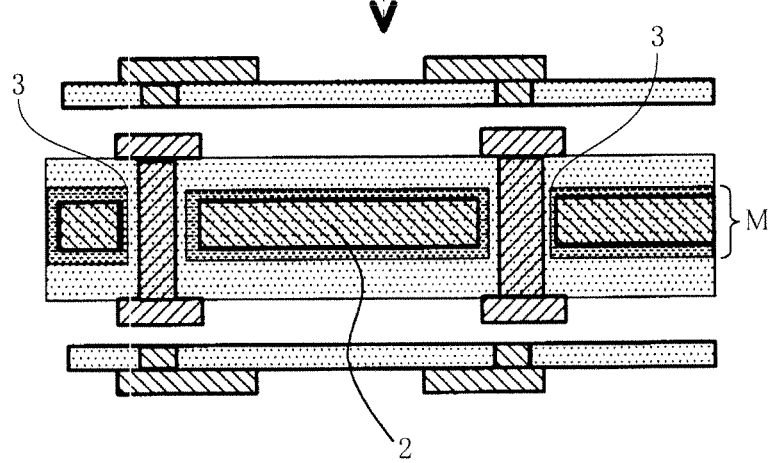
Figure 4A:
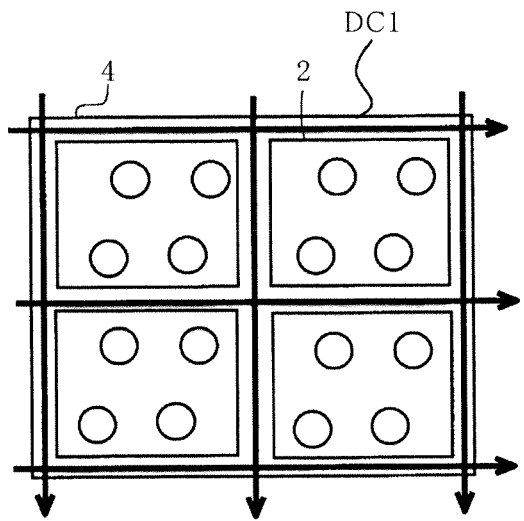
FIG. 4 is a view of an element mounting substrate according to one embodiment of the present invention.
Figure 4B:
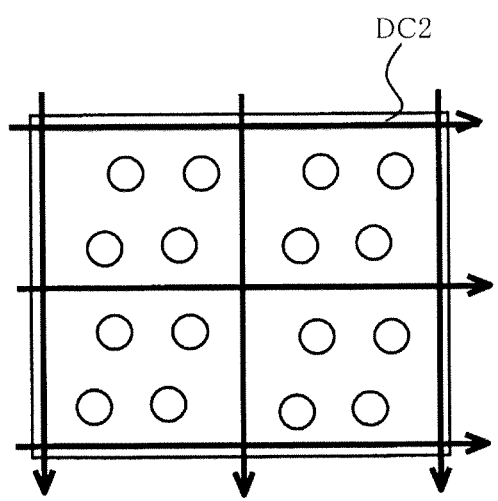
Figure 5A:
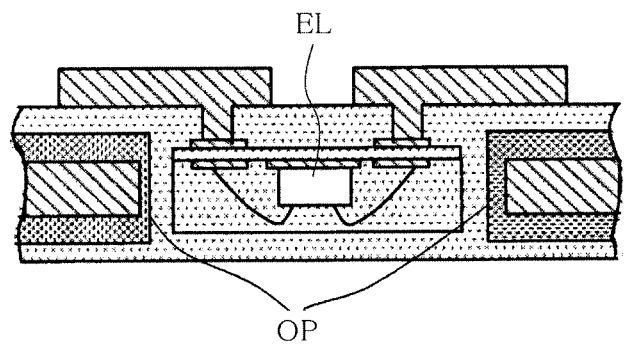
FIG. 5 is a view of an element mounting substrate and a semiconductor module according to one embodiment of the present invention.
Figure 5B:
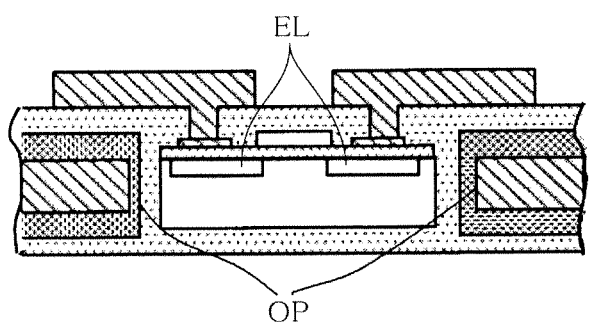

In FIG. 3, the example of the structure shown in FIGS. 1A and 1B is more specifically described. FIG. 3A is a perspective view. FIG. 3B is an A-A cross-sectional view of FIG. 3A. FIGS. 4A and 4B are views for explaining a state of the metal core substrate in the dicing. FIGS. 5A and 5B cross-sectional views showing a state in which an element EL is embedded in the element mounting substrate.

In the embodiment shown in FIG. 3, as shown in FIG. 3B, the four conductive patterns are provided, and, as shown in FIG. 3A, the four through-holes 3 are provided on the single metal core substrate M, for example. In the element mounting substrate, the element EL is embedded in an opening portion OP. The element EL may be a semiconductor bear chip or may be a SIP in which a plurality of semiconductor elements and passive elements are one package. Particularly in the SIP, since the number of terminals to be connected to the electrode of the metal core substrate is reduced, the reliability is improved. For example, when an IC bear chip and a transistor are embedded in a bared manner, the number of terminals of IC and three terminals of the transistor are required as connection. However, a plurality of elements sealed in one package are embedded as shown in FIG. 5B, whereby the number of the terminals to be connected of the package and the metal core substrate is reduced. The embedded elements EL are arranged while being slightly shifted from the center as shown in FIG. 3A. The dotted lines of FIG. 3A having an arrow at one end and perpendicular to each other are the vertical and horizontal centerlines of the element mounting substrate, and the intersection is the center of the element mounting substrate. As seen from the drawing, the element EL is arranged while being shifted from the intersection as the center.

FIG. 4A shows a separation method. Each of the metal cores 2 is constituted of a single plate-like substrate, and the metal cores are arranged in the form of a matrix. The solid arrows arranged in the vertical direction are the dicing lines. In this example, the metal core 2 is not directly diced, and the insulating resin film 4 provided between the metal cores 2 is diced to be separated. According to this constitution, the metal core 2 is not exposed on the side surface of the element mounting substrate 1 as shown in FIGS. 1A and 2A, and, at the same time, since the ceramic film which is a self-generated film including the side surface is formed, the withstand voltage property is improved.

FIG. 4B shows a separation method according to an alternative embodiment different from the one shown in FIG. 4A. In the present embodiment, the outer solid line shows the single metal core substrate M. An area that can normally realize four element mounting substrates is previously provided on a single metal substrate, and the metal core substrate M itself is directly diced afterward (diced in an area shown by a thick dashed line (DC2) in FIG. 1B). In this case, since the metal core substrate M is not required to be previously separated as in the embodiment of FIG. 4A, it is simple as a manufacturing method. The metal core 2 is exposed on the side surface of the element mounting substrate 1 after dicing, and a high level of heat radiation property is obtained.

FIG. 6 shows another embodiment of the present invention. FIG. 6A is a perspective view. FIG. 6B is an A-A cross-sectional view of FIG. 6A. FIG. 6C is a view showing a state of a metal core substrate in the dicing. FIG. 6D is a cross-sectional view showing a state in which the element EL is embedded in the element mounting substrate.

Figure 6A:
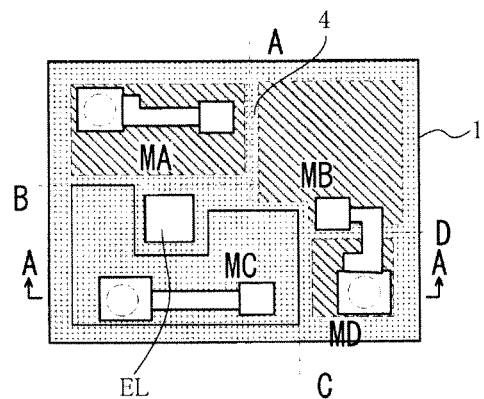
FIG. 6 is a view of an element mounting substrate and a semiconductor module according to one embodiment of the present invention.

As shown in FIG. 6A, four large and small metal core substrates MA to MD are embedded into the single element mounting substrate 1. In the ceramic film which is a point of the embodiment in which a portion between the metal core substrates MA to MD diced into individual pieces is embedded with the insulating resin layer 4, all the front, rear, and side surfaces of the metal core substrate are coated with the ceramic film, and the rigidity of each of the metal core substrates MA to MD is improved. However, since a portion between the adjacent metal core substrates MA to MD is constituted of the insulating resin layer 4, the metal core substrate M is inevitably easily folded at the portion. Thus, in the present embodiment, the insulating resin film 4 between the metal core substrates MA to MD adjacent to each other is not extended from one side of the element mounting substrate 1 to the opposing side, and the metal core substrate MA to MD is arranged in the middle thereof, so that the insulating resin film 4 is blocked there. For example, the insulating resin film 4 between the metal core substrate MA and the metal core substrate MB is blocked by the metal core substrate MC as shown by the arrow A in FIG. 6A. Similarly, the insulating resin film 4 between the metal core substrate MA and the metal core substrate MC is blocked by the metal core substrate MB as shown by the arrow B. The insulating resin film 4 between the metal core substrate MC and the metal core substrate MD and the insulating resin film 4 between the metal core substrate MB and the metal core substrate MD are blocked by another metal core substrate M as shown by the arrows C and D, respectively. Therefore, the substrate is prevented from being broken or bent at once from one side of the element mounting substrate to the opposing side.

Figure 6B:
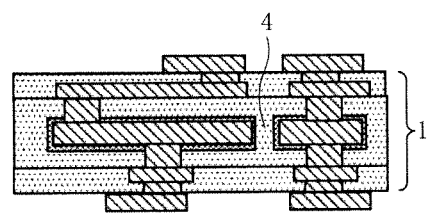
Figure 6C:
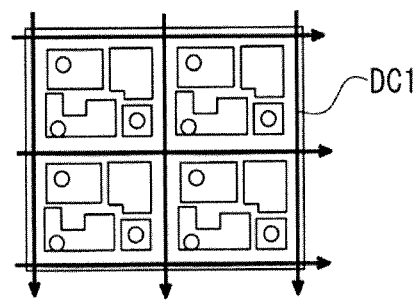
Figure 6D:
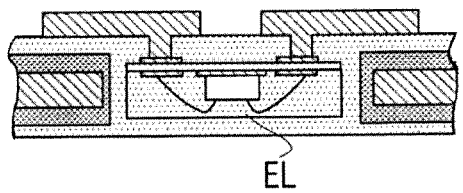
Figure 7A:
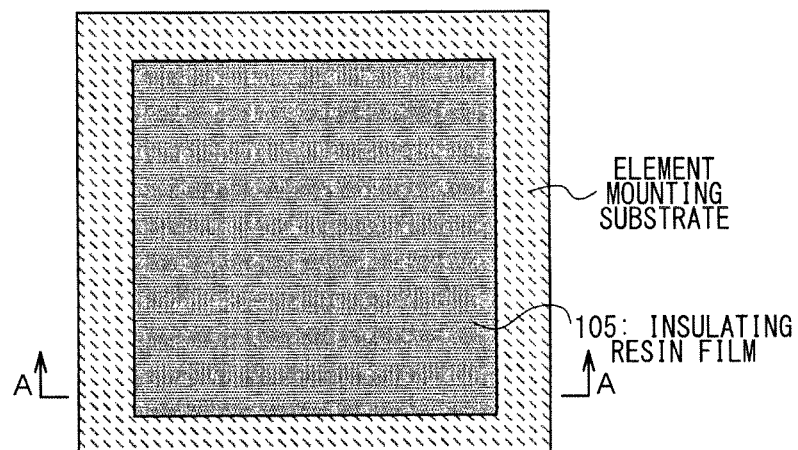
FIG. 7 is a view of a conventional semiconductor device.
Figure 7B:
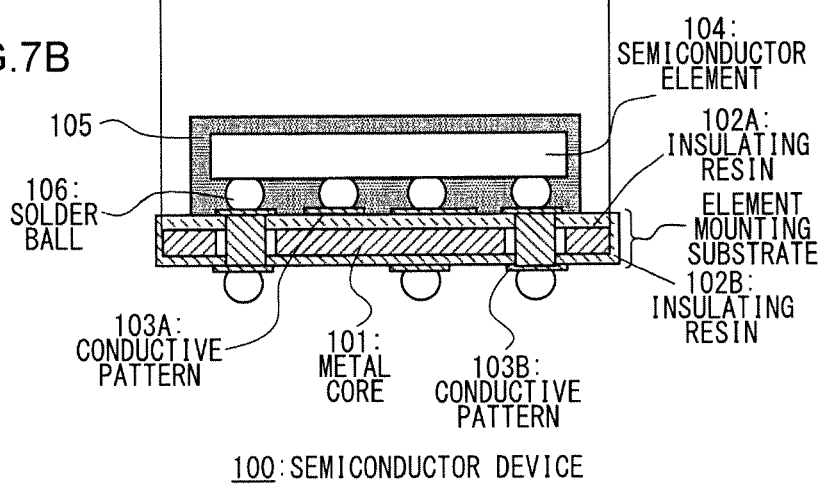
Figure 8A:
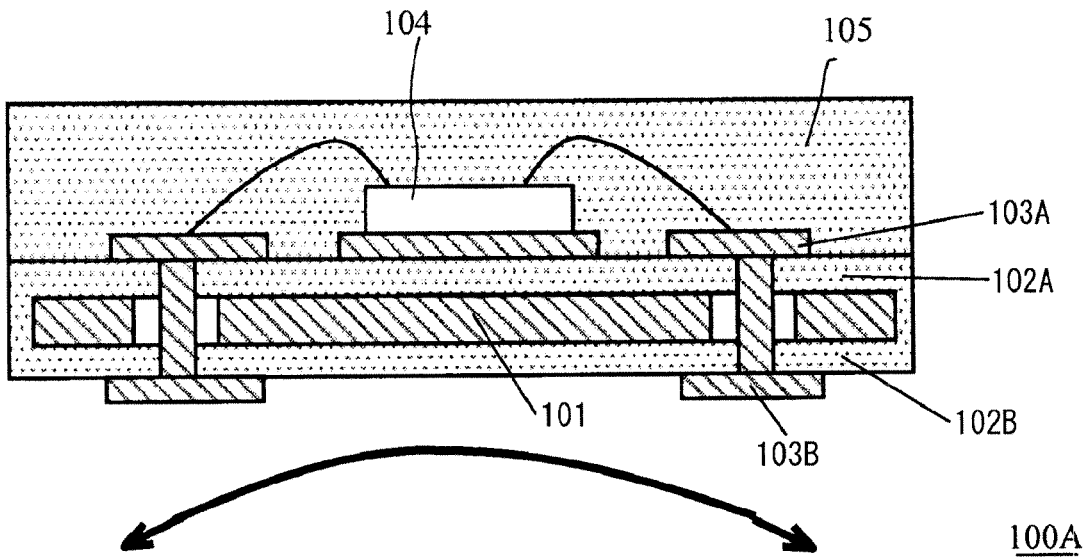
FIG. 8 is a view of a conventional semiconductor device.
Figure 8B:
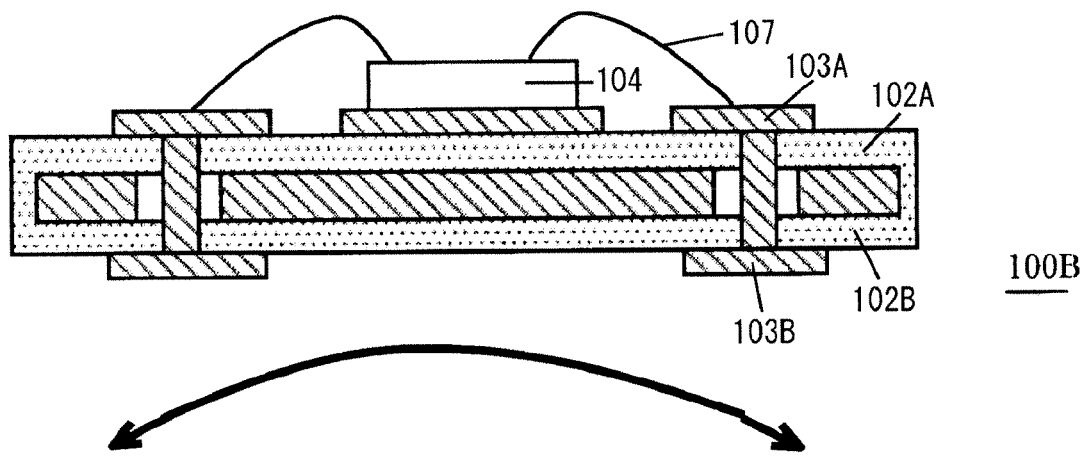

In the element mounting substrate 1 shown in FIG. 6A, a portion of the metal core substrate MA-MD is eliminated, and the element EL constituted of a bear chip or a SIP is embedded into the element mounting substrate as shown in FIG. 6D. In the three metal core substrates MA, MC, and MD, the metal core 2 is exposed at portions shown by point circles (contact holes opening in the insulating resin) and, as shown in FIG. 6B, the wiring on the substrate and the metal core 2 are in contact with each other through the hole.

Thick arrows of FIG. 6C show the dicing lines and show that the metal core substrate is arranged to be retracted inward from the side of the element mounting substrate. According to this constitution, the metal core substrate M is not exposed on the side surface of the element mounting substrate 1, and, at the same time, since the ceramic film which is a self-generated film including the side surface is formed, the withstand voltage property is improved.

Further, the metal core substrate is utilized as a relay of the via, and therefore, the metal core substrate can be separated at a portion requiring electrical separation. Therefore, the hole penetrating through the metal core substrate is not required to be formed, and since the depth of the via becomes small, a fine via is easily formed.

Next, a method of manufacturing the element mounting substrate shown in FIG. 1B is described using FIGS. 9 to 13.

Figure 9A:
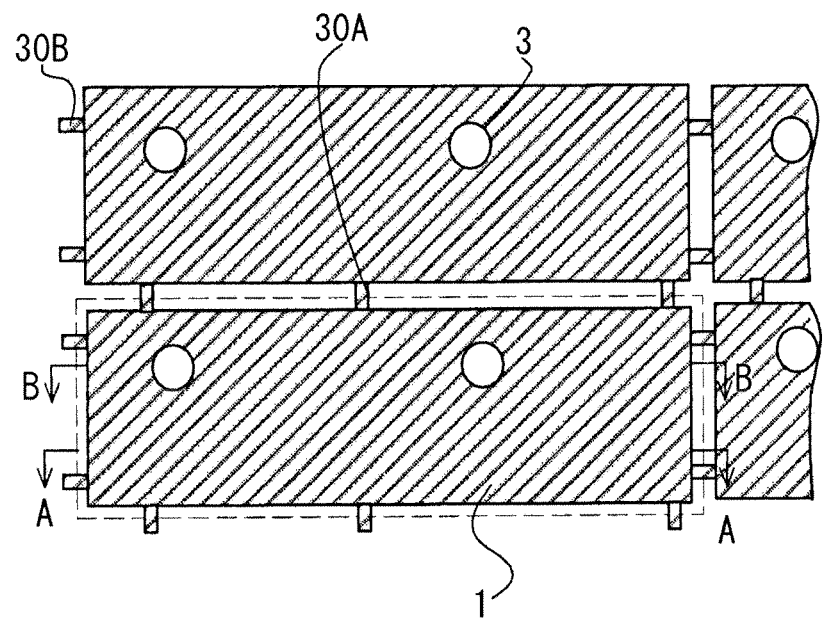
FIG. 9 is a view for explaining a manufacturing method of an element mounting substrate according to one embodiment of the present invention.
Figure 9B:
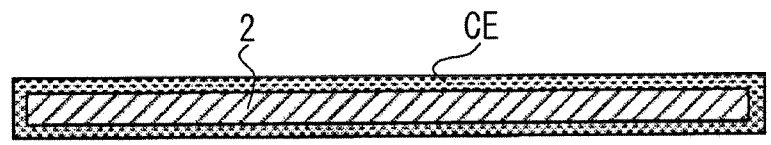
Figure 9C:

FIG. 9A is a plan view of the metal core substrate M in the method of manufacturing the element mounting substrate. FIG. 9B is an A-A cross-sectional view of FIG. 9A. FIG. 9C is a B-B cross-sectional view of FIG. 9A.

First, the plate-like metal core substrates M provided on the single element mounting substrate 1 are arranged in a planar manner in the vertical and horizontal directions and integrated by connecting pieces 30A and 30B extending in the vertical and horizontal directions, respectively. The metal core substrate M shown in FIG. 9A is formed as follows. First, the metal core 2 is formed by pressing or etching a metal sheet or a metal foil. Next, as shown in FIGS. 9B and 9C, the ceramic film is formed in a self-generating manner on the front, rear, and side surfaces of the metal core 2. According to the above, the metal core substrate M shown in FIG. 9A is formed. At that time, the through-holes 3 are formed as shown in FIG. 9C (B-B cross section of FIG. 9A), and the ceramic film CE is formed on the inner side wall of the through-hole 3. When it is considered to separate into the element mounting substrates 1 by, for example, dicing with a rotating blade, laser dicing, or press cutting to be performed later, it is preferable that a self-generating film is not formed at a portion of a connecting piece corresponding to a separation line.

Figure 10A:
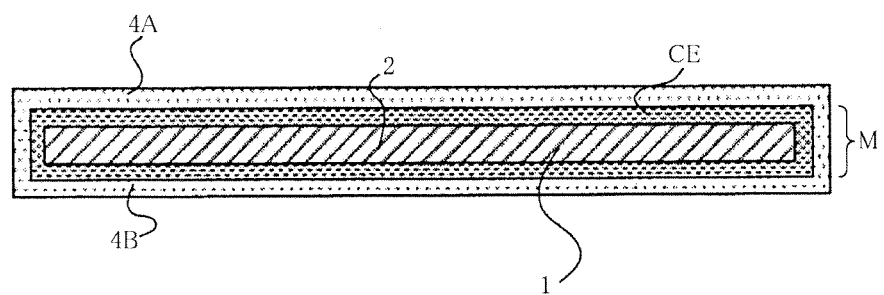
FIG. 10 is a view for explaining the manufacturing method of an element mounting substrate according to one embodiment of the present invention.
Figure 10B:
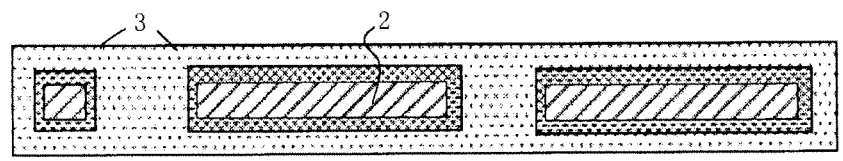

Subsequently, the insulating resin film is formed on the surface of the ceramic film. FIG. 10A shows a state in which the insulating resin film 4 is formed on the cross section shown in FIG. 9B. FIG. 10B shows a state in which the insulating resin film 4 is formed on the cross section shown in FIG. 9C.

As shown in FIGS. 10A and 10B, the front and rear surfaces of the metal core substrate M are in a flat state and covered by the ceramic film CE and the insulating resin film 4, and the side surface of the metal core substrate M and the side wall of the through-hole 3 are coated with the ceramic film and the insulating resin film, as well.

Figure 11A:
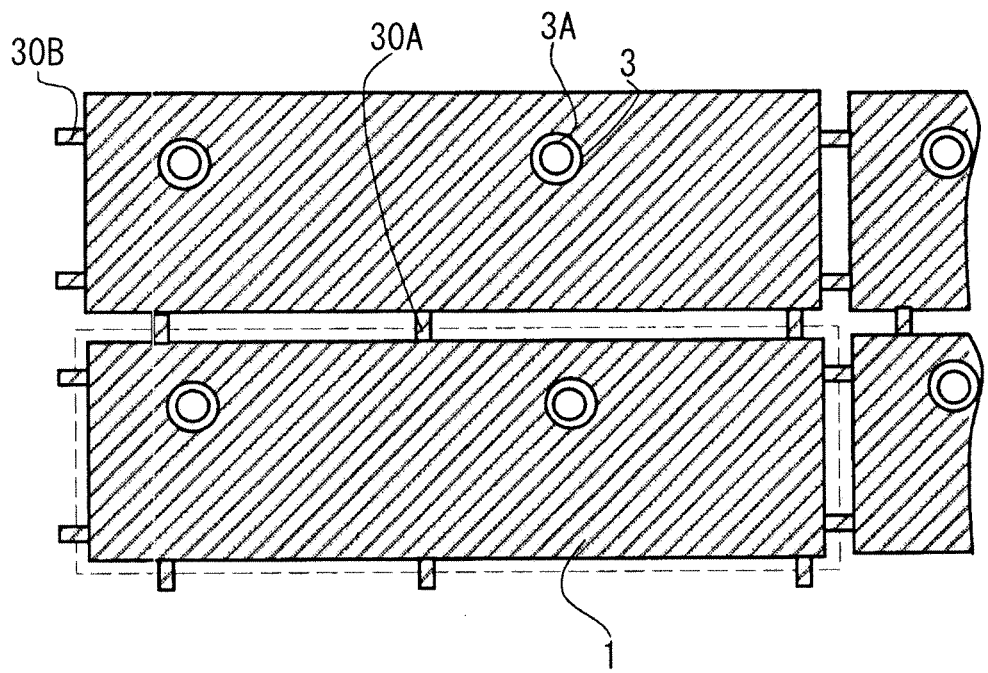
FIG. 11 is a view for explaining the manufacturing method of an element mounting substrate according to one embodiment of the present invention.
Figure 11B:
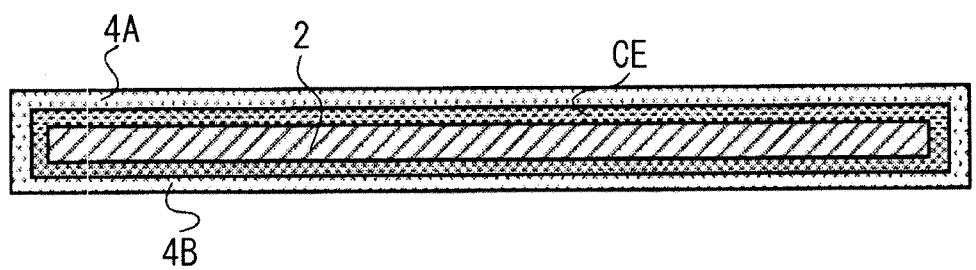
Figure 11C:
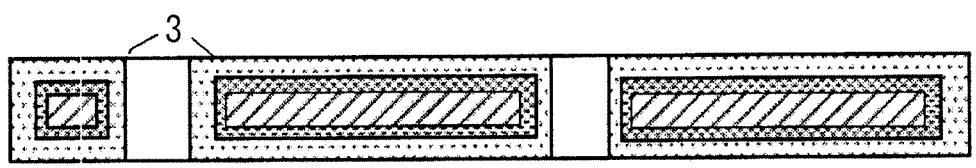

Subsequently, as shown in FIG. 11, through-holes are formed. FIG. 11A is a plan view. FIG. 11B is an A-A cross-sectional view of FIG. 11A. FIG. 11C is a B-B cross-sectional view of FIG. 11A. The through-holes are formed by forming a second through-hole 3A having a smaller diameter than the through-hole 3, while remaining the ceramic film CE and the insulating resin film 4 formed on the side wall of the through-hole 3. Since the area where the second through-hole 3A is formed is constituted only of the insulating resin film, the through-hole 3A can be easily formed by a laser, a drill, or a punching machine. In the side wall of the through-hole 3 and the side wall of the metal core substrate M, the outer side of the metal core substrate M is doubly coated with the ceramic film and the insulating resin film.

Figure 12A:
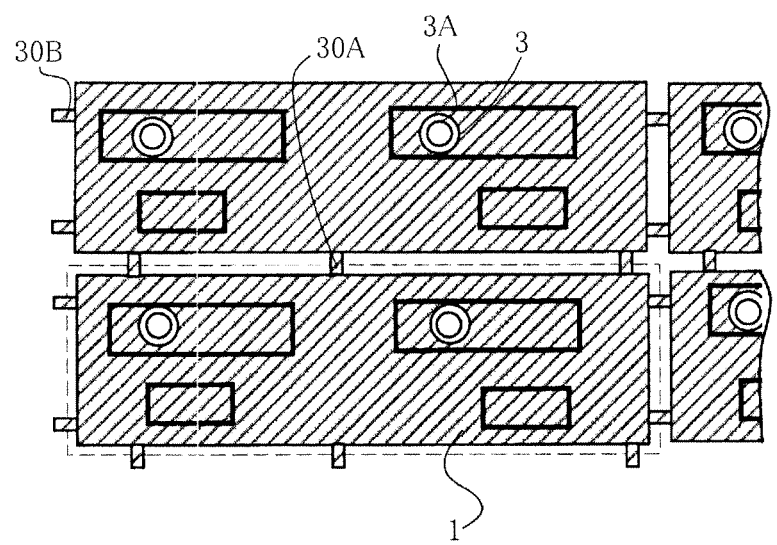
FIG. 12 is a view for explaining the manufacturing method of an element mounting substrate according to one embodiment of the present invention.
Figure 12B:
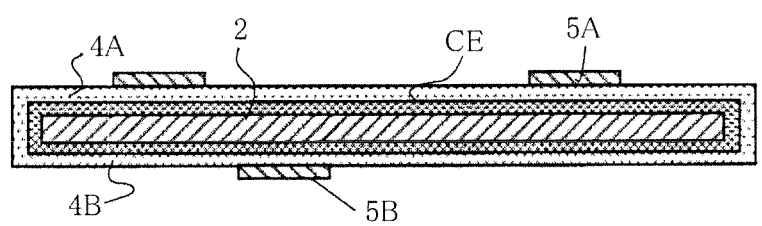
Figure 12C:
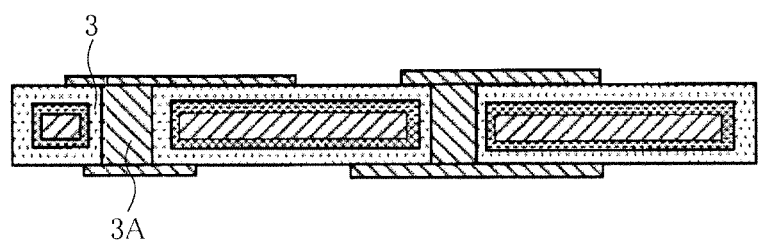

Further, as shown in FIG. 12, a conductive material is embedded in the second through-hole 3A with plating, conductive paste, or solder, for example. According to this constitution, the conductive pattern 5A on the front surface of the element mounting substrate to be formed later and the conductive pattern 5B on the rear surface are electrically connected. The conductive pattern 5A and the conductive pattern 5B may be electrically connected by forming a conductive film on the side wall of the second through-hole 3A, or a conductive paste such as Ag, plating, and so on may be filled in the second through-hole 3A.

Figure 13:
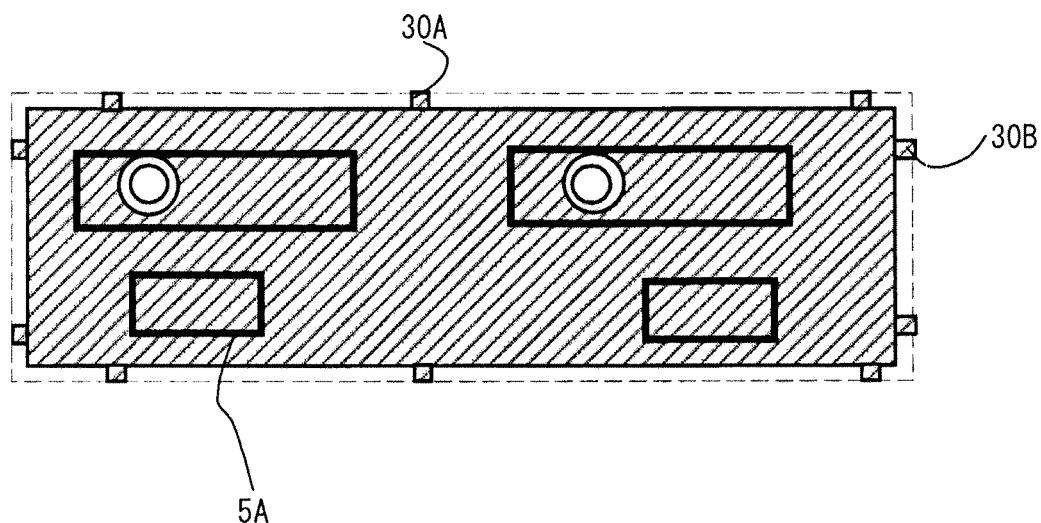
FIG. 13 is a view of an element mounting substrate according to one embodiment of the present invention.

Finally, although not illustrated, a portion corresponding to the connecting piece is separated by a press, laser dicing, or dicing with a rotating blade. The completed element mounting substrate is shown in FIG. 13 and corresponds to a portion shown by the dotted line in FIGS. 9A and 11A. The insulating resin layer 4 is exposed on the end surface of the completed element mounting substrate, and the side walls of the connecting pieces 30A and 30B appear from a portion thereof. When the element mounting substrate is diced into individual pieces, only a connecting piece portion having a small width is formed of a metal material, and therefore, the burden on a blade and so on is small, and the metal core substrate can be easily separated.

The semiconductor element is mounted on the element mounting substrate, and the semiconductor module is provided. The semiconductor element of the semiconductor module is sealed with an insulating resin, and the semiconductor device is provided.

What is claimed is:
1. An element mounting substrate comprising:
at least three metal core substrates arranged in parallel with, but not stacked, each other; and
insulating resin embedded among the metal core substrates,
each metal core substrate including:
a metal core mainly composed of metal;
a first ceramic film formed on one main surface of the metal core;
a second ceramic film formed on the other main surface of the metal core;
a first insulating resin film formed on a surface of the first ceramic film; and
a second insulating resin film formed on a surface of the second ceramic film, wherein
the insulating resin between two metal core substrates adjacent to each other does not extend from one side of the element mounting substrate to an opposing side, and another metal core substrate is arranged between the one side and the opposing side so that the insulating resin is blocked by the another metal core substrate.

2. The element mounting substrate according to claim 1, further comprising:
   a first conductive pattern formed on a surface of the first insulating resin film; and
   a second conductive pattern formed on a surface of the second insulating resin film.

3. The element mounting substrate according to claim 1, wherein a thickness of the first ceramic film is greater than the thickness of the metal core.

4. The element mounting substrate according to claim 1, wherein a thickness of the second ceramic film is greater than the thickness of the metal core.

5. The element mounting substrate according to claim 1, wherein the metal core is formed of metal mainly made of Al, and the first ceramic film and the second ceramic film are mainly composed of an Al oxide film.

6. The element mounting substrate according to claim 1, wherein the metal core comprises a through-hole, and an inner wall of the through-hole is coated with a ceramic film having the same components as the first ceramic film or the second ceramic film.

* * * * *